United States Patent [19]
Kodama

[11] Patent Number: 6,139,335
[45] Date of Patent: Oct. 31, 2000

[54] CONNECTOR CONNECTION STRUCTURE TO FLEXIBLE PRINTED CIRCUIT BOARD IN METER CASE

[75] Inventor: Shinji Kodama, Shizuoka, Japan

[73] Assignee: Yazaki Corporation, Tokyo, Japan

[21] Appl. No.: 09/316,109

[22] Filed: May 20, 1999

[30] Foreign Application Priority Data

Jun. 2, 1998 [JP] Japan ................................... 10-152918

[51] Int. Cl.⁷ .................................................... H01R 12/00
[52] U.S. Cl. ............................................. 439/77; 439/140
[58] Field of Search ................................. 439/67, 77, 82, 439/55, 492, 140

[56] References Cited

U.S. PATENT DOCUMENTS

| | | | |
|---|---|---|---|
| 3,154,365 | 10/1964 | Crimmins .................................. | 439/67 |
| 4,374,603 | 2/1983 | Fukunaga et al. ......................... | 439/77 |
| 5,051,100 | 9/1991 | Kato et al. ................................ | 439/140 |
| 5,230,636 | 7/1993 | Masuda et al. ........................... | 439/140 |
| 5,232,373 | 8/1993 | Sawada .................................... | 439/140 |
| 5,277,603 | 1/1994 | Yamatani et al. ........................ | 439/140 |
| 5,675,888 | 10/1997 | Owen et al. ............................... | 439/77 |

*Primary Examiner*—T. C. Patel
*Attorney, Agent, or Firm*—Finnegan, Hendeson, Farabow, Garrett & Dunner, L.L.P.

[57] ABSTRACT

The connection structure includes a case having an insertion recess, in which a flexible printed circuit board (called FPC hereinafter) is provided, and a connector having a terminal to contact the FPC. The connector is insertable in the recess so that a conductor of the FPC can electrically connect to the terminal. Between the case and the FPC, a hollow frame having a hardness larger than the case is provided. The connector may have a lock arm with a locking protrusion and the hollow frame has a guide channel for receiving the lock arm. The guide channel having a locking portion associated with the locking protrusion. The connector may have a pivoting lever being pivotably supported by an axis provided on an outer surface of the housing, and the terminal has a resilient contact piece extending from the housing. The pivoting lever is able to pivot freely from the resilient contact piece. The pivoting lever has a locking portion at one end thereof and a movement limiting portion at the other end thereof. The hollow frame has a locking channel and a retaining slit respectively associated with the locking portion and the movement limiting portion. The movement limiting portion engages with the retaining slit so that the connector can be inserted into the recess with a reduced mating force.

4 Claims, 7 Drawing Sheets

CONNECTOR CONNECTION STRUCTURE TO FLEXIBLE PRINTED CIRCUIT BOARD IN METER CASE

BACKGROUND OF THE INVENTION

1. Field of the Invention

The present invention relates to a connector connection structure to a flexible printed circuit board provided in an automobile meter case.

2. Prior Art

Figure 10:
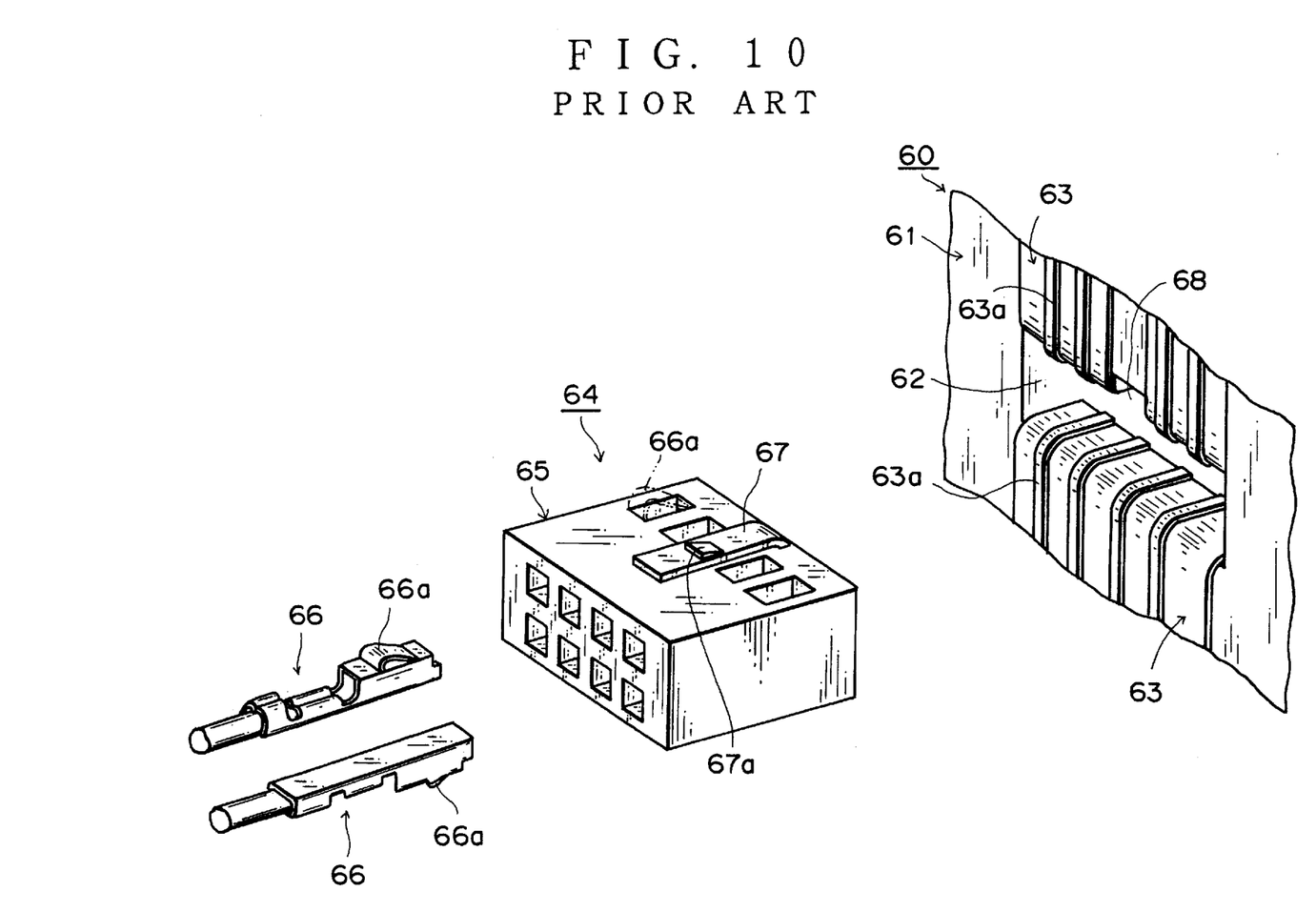
FIG. 10 is a general perspective view showing a prior-art connection structure.

Referring to FIG. 10, there is illustrated a conventional automobile meter case 60, which has a resin case 61 formed with an insertion recess 62 for receiving a connector 64 to electrically connect to a conductor 63a of a flexible printed circuit board (called FPC hereinafter) 63. The connector 64 accommodates a plurality of terminals 66 each having a resilient contact piece 66a protruding from the connector housing 65. When the connector 64 has been inserted into the recess, each resilient contact piece 66a contacts one of the conductors 63a of FPC 63 to electrically connect thereto. At the same time, a lock arm 67 formed on the connector 64 is guided by a guide channel 68 defined in the case 61 so that a locking protrusion 67a formed on the lock arm 67 engages with a lock hole (not shown) defined in the guide channel 68. The conductor 63a is exposed in the upper surface of FPC 63 laid in the recess 62.

Figure 11:
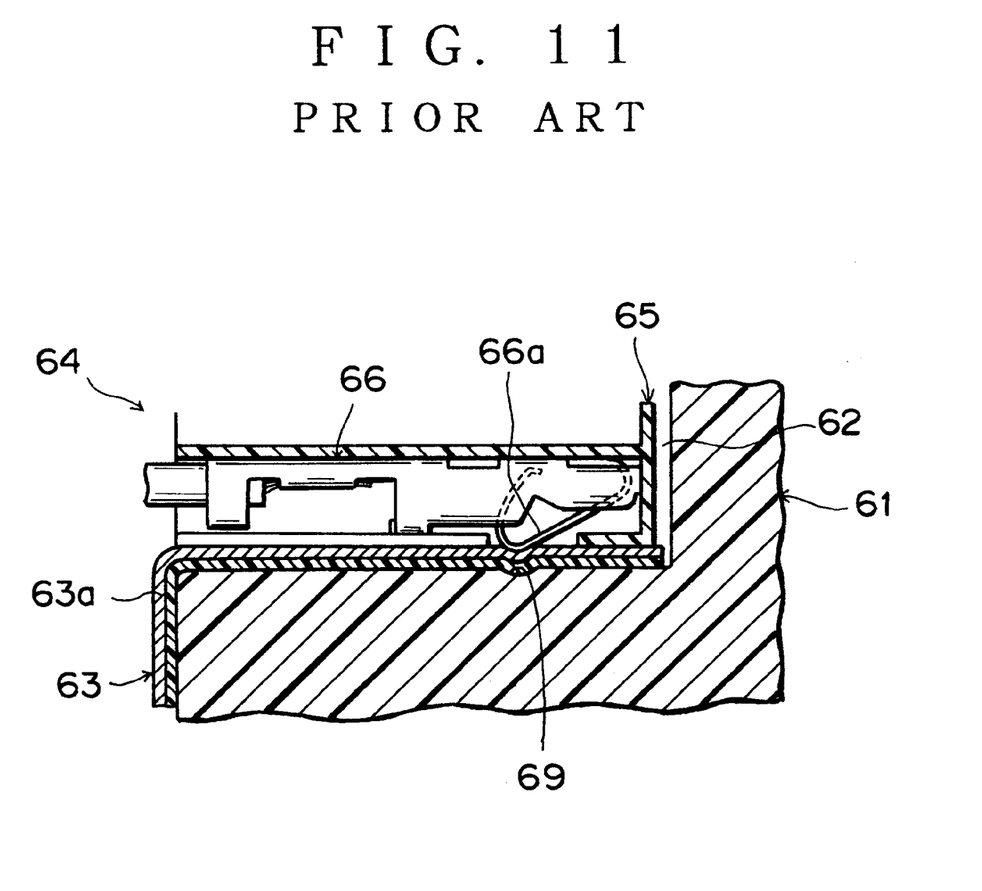
FIG. 11 is a sectional view showing a state in which a connector of FIG. 10 has been engaged with an insertion recess.

However, after a meter case 60 has been mounted in an automobile body (not shown), the case 61 deteriorates with time to arise a concave 69 in the case 61 in relation to a contact point of the resilient contact piece 66a and the conductor 63a (see FIG. 11). Thus, the conductor 63a of FPC 63 deflects into the concave 69, thereby decreasing a contact force of the resilient contact piece 66a against the conductor 63a, resulted in an unreliable electrical contact pressure thereof. In addition, since the connector 64 has a larger number of terminals, a lager force is required for inserting the connector 64 into the recess 62. Moreover, since the lock hole associated with the locking protrusion 67a is inside the case 61, it is not definitely recognized that the locking protrusion 67a has engaged with the lock hole, because a lock notifying sound (click) thereof is not clear.

SUMMARY OF THE INVENTION

In view of the above-mentioned disadvantages in the prior art, an object of the present invention is to provide a connector connection structure to a FPC in a meter case, which can keep a correct electrical contact of terminals in the connector and conductors of the FPC even when a case of the meter has deteriorated.

For achieving the aforementioned object, a first aspect of the present invention is a connector connection structure to a FPC in an automobile meter includes: a case having an insertion recess, in which a flexible printed circuit board (called FPC hereinafter), and a connector having a terminal to contact the FPC. The connector is insertable in the insertion recess so that a conductor of the FPC can electrically connect to the terminal. Between the case and the FPC, a hollow frame having a hardness larger than the case is provided.

In a second aspect of the invention, the connector has a housing formed with a lock arm. The lock arm has a locking protrusion, and the hollow frame has a guide channel for receiving the lock arm. The guide channel has a locking portion associated with the locking protrusion.

The connector has a housing and a pivoting lever, the pivoting lever being pivotably supported by an axis provided on an outer surface of the housing, and the terminal has a resilient contact piece extending from the housing. The pivoting lever is able to pivot freely from the resilient contact piece. The pivoting lever has a locking portion at one end thereof and a movement limiting portion at the other end thereof. The hollow frame has a locking channel and a retaining slit respectively associated with the locking portion and the movement limiting portion. The movement limiting portion is engaged with the retaining slit so that the connector can be inserted into the recess with a reduced mating force.

In a fourth aspect of the invention, the pivoting lever has a thickness smaller than the extending height of the resilient contact piece from the housing.

Next, operational effects of the present invention will be discussed.

In the first aspect of the invention, since the recess of the case is fitted with the hollow frame having a larger hardness than the case. The deterioration of the resin case would have no adverse effect on the hollow frame. Since the conductors of the FPC are positioned between the hollow frame and the terminals, the conductors can keep a stable electrical connection to the terminals even if the case deteriorates with time. This enables to keep an original electrical connection condition thereof during a long period. Thus, the automobile meter case which adopts the connection structure improves in reliability.

In the second aspect of the invention, the hollow frame has the guide channel for receiving the lock arm, and the guide channel has a locking portion associated with the locking protrusion of the lock arm. Thus, pushing the connector into the recess engages the locking protrusion with the locking channel, allowing sure coupling of the connector with the recess.

In the third aspect of the invention, the pivoting lever is supported by an axis provided on an outer surface of the housing so as to pivot freely from the resilient contact piece protruding from the housing. Furthermore, the hollow frame has the locking channel and the retaining slit respectively associated with the locking portion and the movement limiting portion. Thus, after entering the movement limiting portion into the retaining channel, pushing the connector allows the connector to be inserted into the recess with a significantly reduced mating force. Particularly, such connectors having a large number of terminals could be surely engaged with the recess easily.

In the fourth aspect of the invention, the pivoting lever has a thickness smaller than the extending height of the resilient contact piece from the housing. Thereby, the pivoting lever does not contact the conductors of the FPC, so that the pivoting lever is not disadvantageous for the conductors to keep a stable electrical connection to the resilient contact piece.

DETAILED DESCRIPTION OF THE PREFERRED EMBODIMENTS

Referring to the accompanied drawings, embodiments of the present invention will be discussed.

Figure 1:
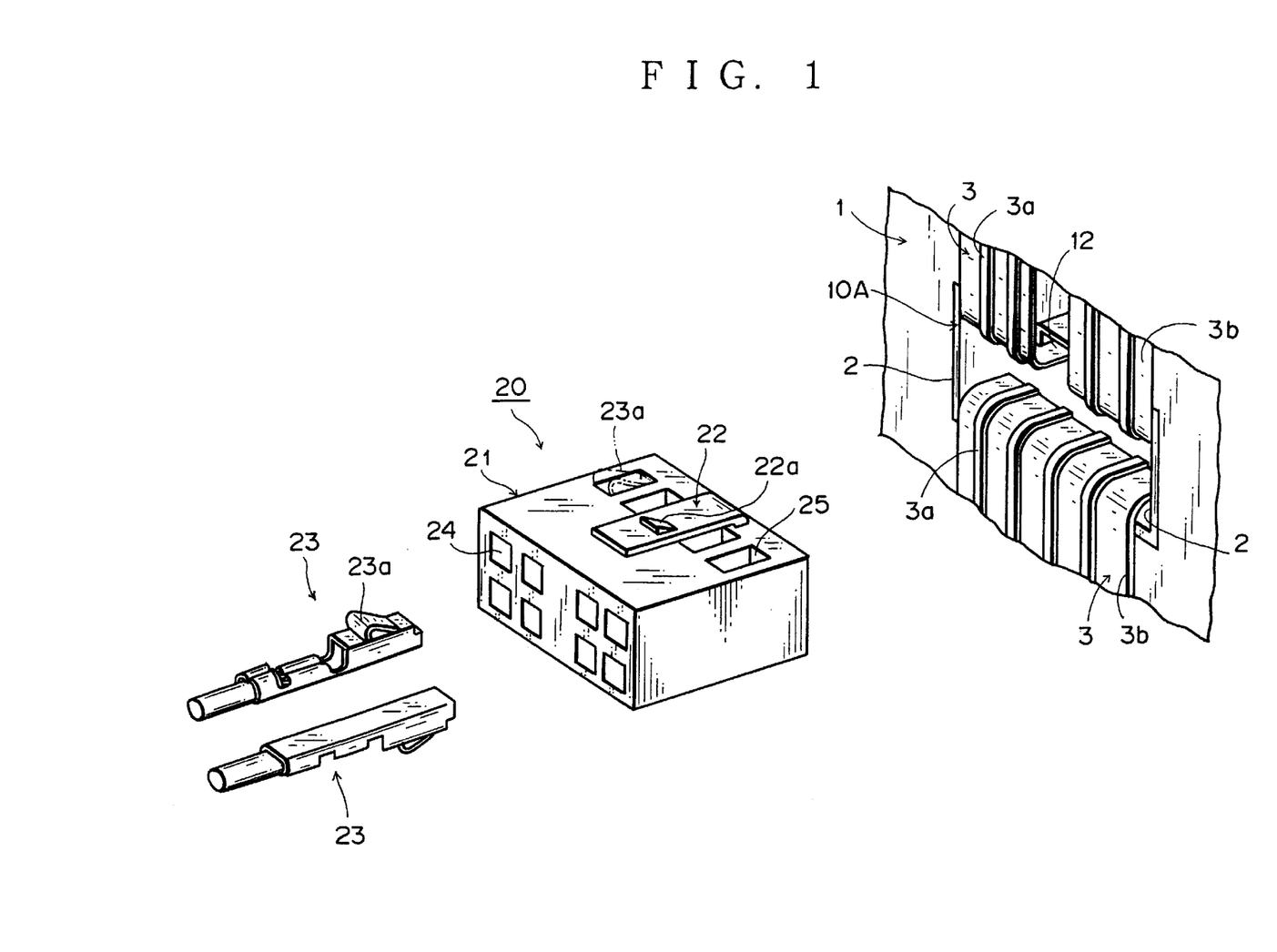
FIG. 1 is a general perspective view showing a first embodiment of a connector connection structure to a FPC in a meter case according to the present invention.
Figure 2:
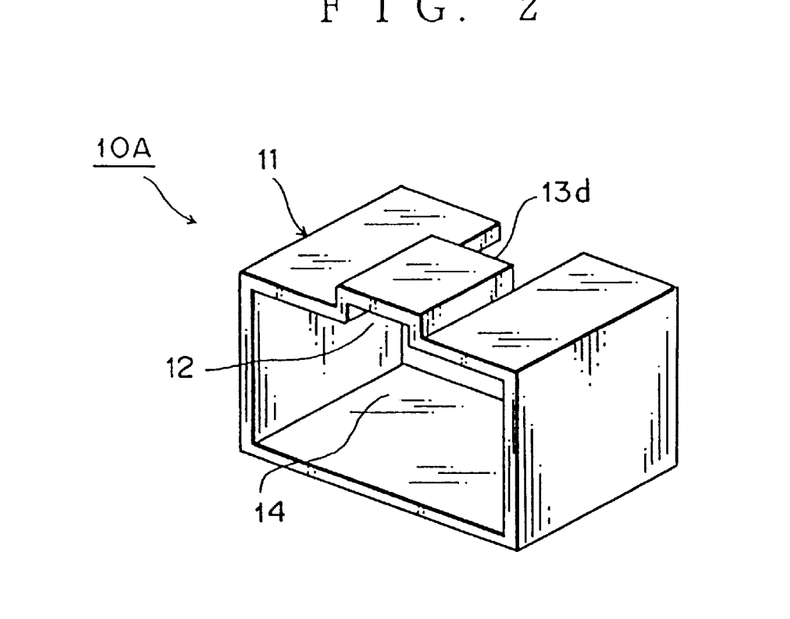
FIG. 2 is an enlarged perspective view of a hollow frame of FIG. 1.
Figure 3:
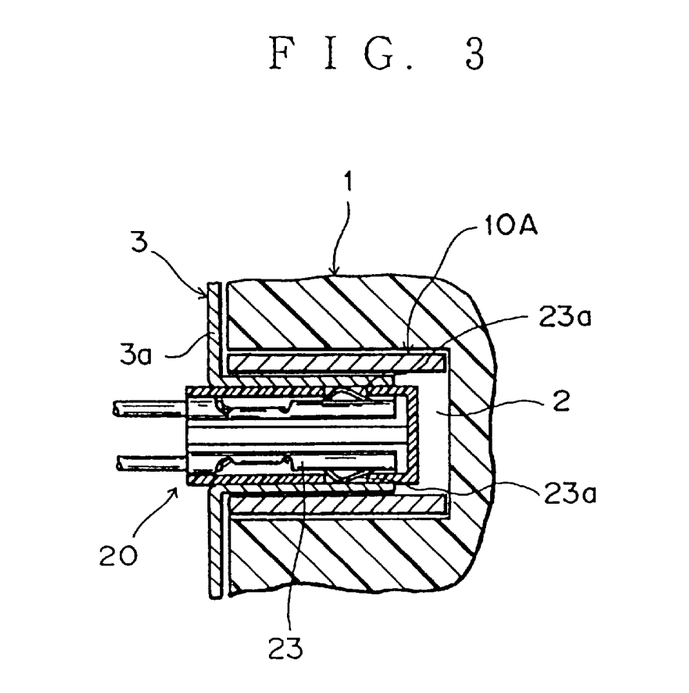
FIG. 3 is a sectional view showing a state in which the connector has been engaged with an insertion recess.

FIG. 1 to 3 show a first embodiment of a connector connection structure to a FPC in a meter case. Components identical with those described in the prior art have the identical numerals and will not be explained in detail again.

The connection structure shown in FIG. 1 has a case 1 formed with an insertion recess 2. The recess 2 is fitted with a rectangular hollow frame 10A inside the recess. A FPC 3 is inserted into the recess 2 so as to be laid on an inside surface of the hollow frame 10A. The recess 2 receives a connector 20.

The hollow frame 10A shown in FIGS. 1 and 2 is made of a material harder than the case 1 made of a resin. In this embodiment, its frame 11 is made of a metal. The connector 20 has a lock arm 22, and the frame 11 is formed with a guide channel 12 in a top part thereof in relation to the lock arm 22. In the rear of the guide channel 12, there is defined a locking portion 13d associated with a locking protrusion 22a of the lock arm 22. The hollow frame 10A may be pre-fabricated to be mounted in the case 1 or may be completed by injection molding within the recess 2.

After the recess 2 has received the hollow frame 10A, FPC 3 is laid on the hollow frame 10A, and the connector 20 is inserted into the recess 2. Conductors 3a fitted on FPC 3 are sandwiched between a resilient contact piece 23a protruding from the connector 20 and the hollow frame 10A of the terminal 23 (see FIG. 3). Since the hollow frame 10A is made of a harder material than the case 1, the deterioration of the case 1 would have no effect on the hollow frame 10A unlike the prior art. The resilient contact piece 23a of the terminal 23 can maintain substantially the same contact pressure as the original against the conductor 3a of FPC 3. Thus, the resilient contact piece 23a and the conductor 3a can provide a stable electrical connection performance for a longer term than the prior art.

Next, steps for mounting the hollow frame 10A in the recess 2 and for connecting the resilient contact piece 23a of the terminal 23 received in the connector 20 to the conductor 3a of FPC 3 will be discussed.

As illustrated in FIG. 1, the hollow frame 10A is mounted in the recess 2, and FPC 3 is inserted into the recess 2. In this stage, FPC 3 is not stable within the recess 2. By the way, FPC 3 has an insulation cover film 3b on each face thereof.

While one film 3b at the hollow frame side remains, the other film 3b at the opposite side is removed to expose the conductors 3a. Thereby, FPC 3 is insulated at the hollow frame side. Terminal receiving chambers 24 of the connector housing 21 receive the terminals 23 to assemble the connector 20, so that the resilient contact pieces 23a of the terminals 23 protrude outward from openings 25 of the housing 21.

Pushing the connector 20 into the recess 2 causes the resilient contact pieces 23a of the terminals 23 to slide along the conductors 3a of FPC 3. At the same time, the lock arm 22 of the connector 20 moves along the guide channel 12. The locking protrusion 22a of the lock arm 22 engages with the locking portion 13 of the hollow frame 10A with a "click" sound, which indicates complete coupling of the connector 20 with the recess 2. The resilient contact pieces 23a abut against and push the conductors 3a of FPC 3 toward the hollow frame side (see FIG. 3).

FIGS. 4 to 9 show a second embodiment of a connector connection structure to a FPC in a meter case. Components identical with those described in the first embodiment have the identical numerals and will not be discussed in detail again.

Figure 4:
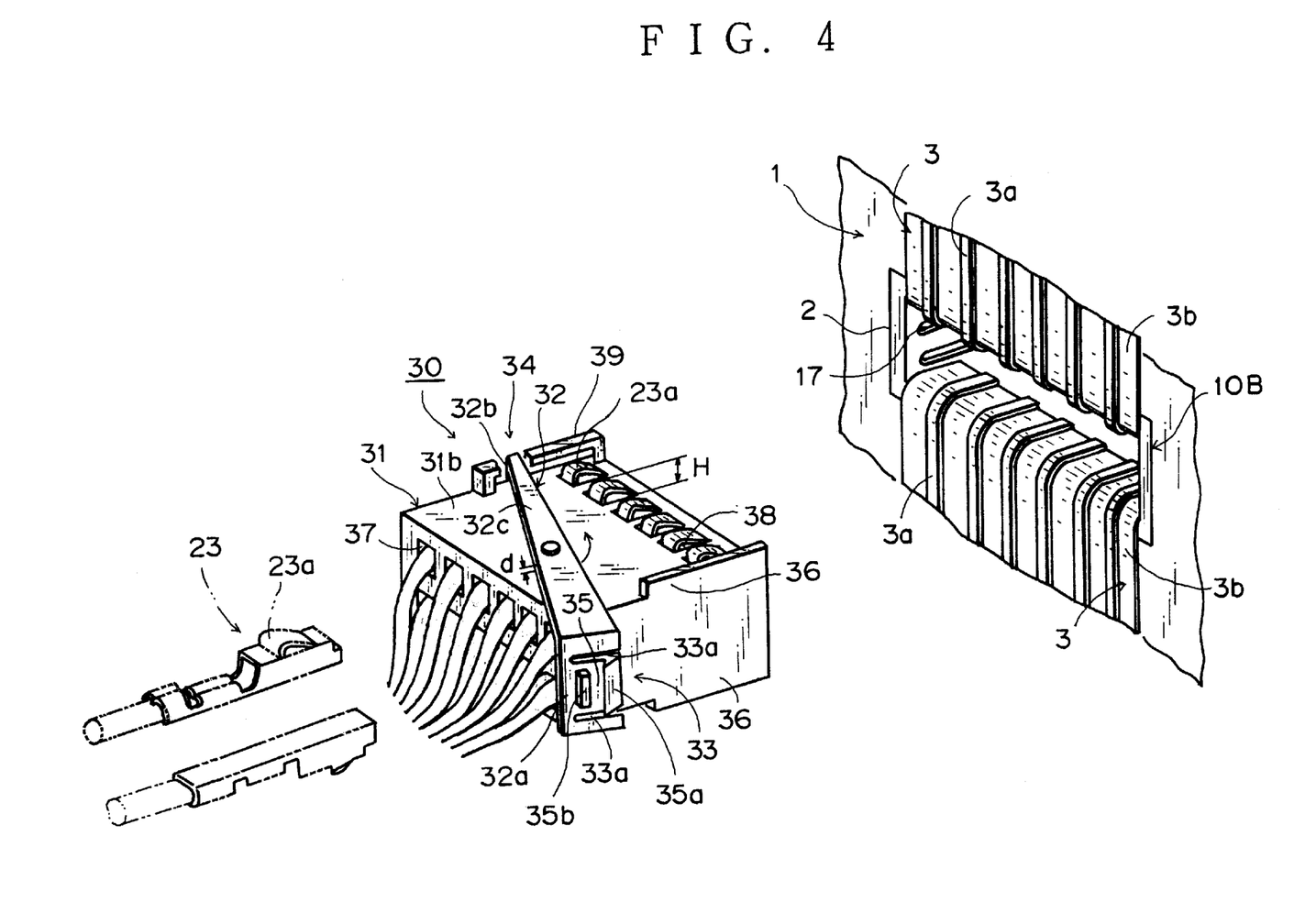
FIG. 4 is a general perspective view showing a second embodiment of a connector connection structure to a FPC in a meter case according to the present invention.

The connection structure shown in FIG. 4 includes a connector housing 31 pivotably axially supporting a pivoting lever 32. The pivoting lever 32 provides a less insertion force to insert a connector 30 into an insertion recess 2 of a case 1 with the hollow frame 10B therebetween.

The pivoting lever 32 has a locking portion 33 in one end wall 32a side thereof and also has a movement limiting portion 34 in the other end wall 32b side thereof. The side wall 32a has a resilient lock piece 35 and a pair of slits 33a each positioned at each side of the lock piece 35. The resilient lock piece 35 has a lock protrusion 35a and a locking rib 35b located a little afterward from the lock protrusion 35a. The other end wall 32b is less than the one side wall 32a in width. A connection plate 32c provided between the one side wall 32a and the other side wall 32b is pivotably supported by a central pin above an upper face of the housing 31. The lever 32 pivots without contacting the resilient contact pieces 23a protruding from the housing 31.

The housing 31 has an upper wall 31b and a lower wall (not shown) each of which has a vertically extending stopper wall 36 for stopping the locking portion 33. On the upper wall 31b, there is provided a gate-shaped protection frame 39 for protecting the other end of the lever 32. The other end of the lever 32 is movable within the protection frame 39. The pivoting lever 32 is pivotable up to a position where it abuts against the stopper wall 36 and becomes substantially normal to the longitudinal direction of the terminal receiving chambers 37 of the housing 31.

Figure 5:
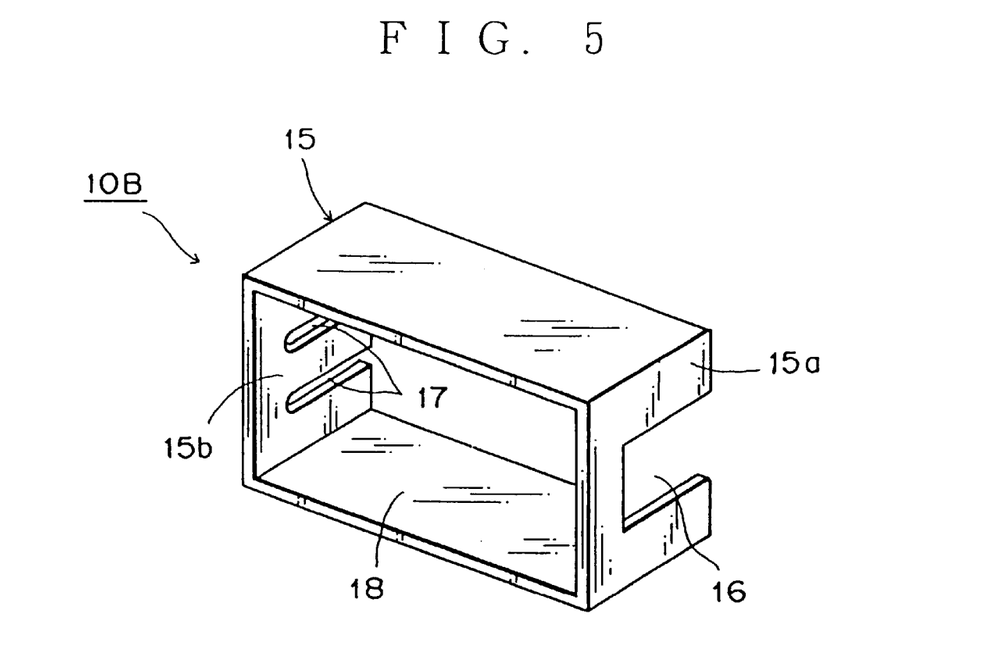
FIG. 5 is an enlarged perspective view of a hollow frame of FIG. 4.
Figure 6:
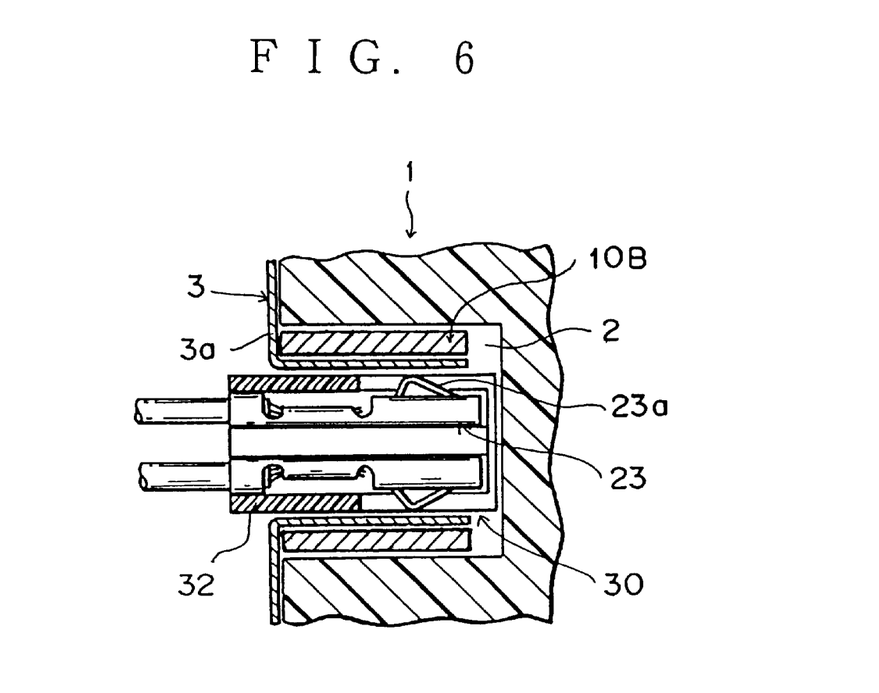
FIG. 6 is a sectional view showing a state in which the connector has been engaged with an insertion recess.

As illustrated in FIGS. 4 and 5, a hollow frame 10B has a frame body 15. A side wall 15a of the frame body 15 is formed with a locking channel 16 associated with the locking portion 33 of the pivoting lever 32. The other side wall 15b of the frame body 15 is formed with a pair of retaining slits 17 associated with the movement limiting portion 34. The hollow frame 10B is slightly larger than the hollow frame 10A (see FIG. 2) of the first embodiment so that the pivoting lever 32 is pivotable when the hollow frame 10B receives the pivoting lever 32. Therefore, the hollow frame 10B has an opening 18 slightly larger than the opening 14 (see FIG. 2) of the hollow frame 10A of the first embodiment. The hollow frame 10B is made of the same material as that of the first embodiment. The hollow frame 10B may be pre-fabricated to be mounted in the case 1 or may be completed by injection molding within the recess 2.

As illustrated in FIG. 4, the outwardly protruding height (distance) H of the resilient contact piece 23a from the housing 31 is larger than the thickness d of the connection plate 32c (H>d). Thus, the connection plate 32c of the pivoting lever 32 can pivot without contacting the conductors 3a of FPC 3.

Next, steps for engaging the connector 30 having the pivoting lever 32 with the recess 2 of the case 1 to electrically connect the resilient contact piece 23a to the conductor 3a of FPC 3 will be discussed.

As illustrated in FIG. 4, the hollow frame 10B is mounted in the recess 2, and then FPC 3 is inserted into the recess 2. The conductor 3a of FPC 3 is not exposed toward the hollow frame 10B but is exposed toward the inside of the recess. Meanwhile, the housing 31 receives a plurality of terminals 23 in the terminal receiving chambers 37 to complete the connector 30. In this state, the resilient contact pieces 23a of the terminals 23 are protruding outward from openings 38 of the housing 31.

Figure 7:
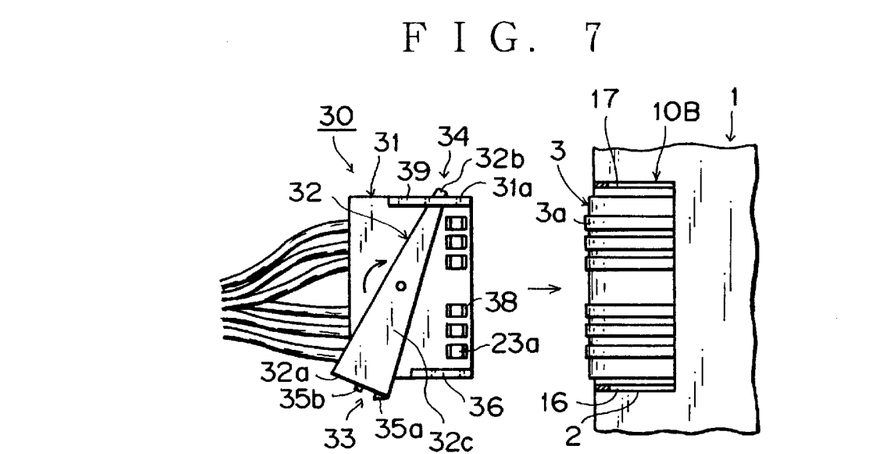
FIG. 7 is an illustration showing a state in which the pivoting lever of FIG. 4 is contacting one side wall of the connector housing.
Figure 8:
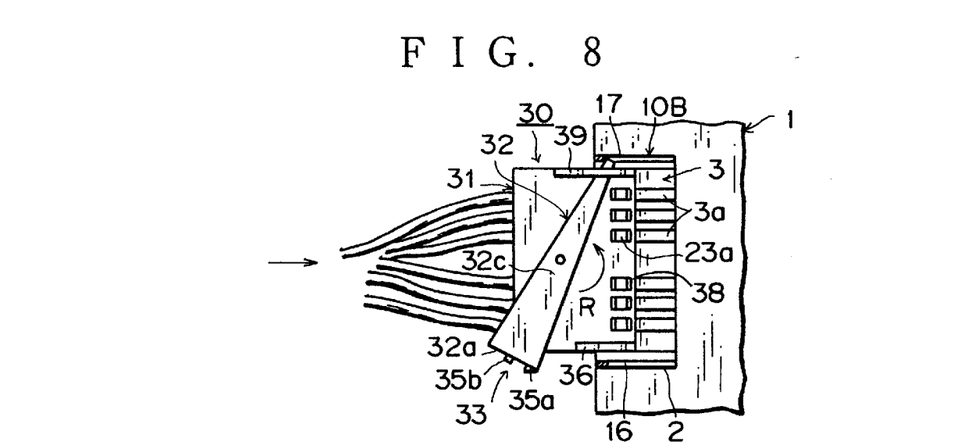
FIG. 8 is an illustration showing a state in which a movement limiting portion of a pivoting lever of FIG. 7 has been inserted into a pair of retaining channels of the hollow frame.

As illustrated in FIG. 7, the pivoting lever 32 of the connector 30 is pivoted clockwise (in the arrow direction) to contact the movement limiting portion 34 of the pivoting lever 32 with a side wall 31a of the housing 31. Then, the connector 30 is inserted into the recess 2, and the movement limiting portion 34 is engaged with the pair of retaining slits 17 of the hollow frame 10B, as illustrated in FIG. 8. Subsequently, the connector 30 is lightly pushed into the recess 2 so that the pivoting lever 32 pivots counterclockwise (in arrow direction R in FIG. 8). With the pivoting, the connector 30 is further drown into the recess 2, while the resilient contact pieces 23a of the terminals 23 slide along the conductors 3a of FPC 3.

Figure 9:
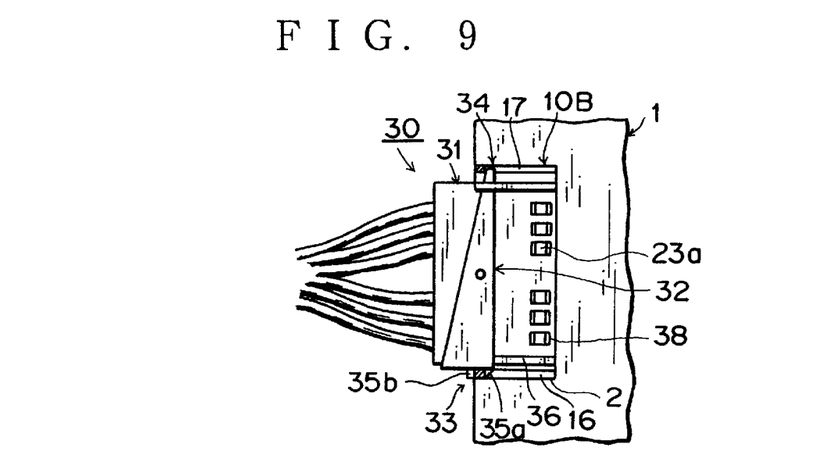
FIG. 9 is an illustration showing a state where the connector of FIG. 7 has been engaged with the recess.

As illustrated in FIG. 9, when the locking portion 33 of the pivoting lever 32 abuts against the stopper wall 36, the locking protrusion 35a of the locking portion 33 engages with the locking channel 16 of the hollow frame 10B. At the same time, the movement limiting portion 34 abuts against ends of the retaining slits 17. Thus, the connector 30 is completely inserted into the recess 2, so that each resilient contact piece 23a electrically connects to the associated conductor 3a.

As discussed of FIGS. 7 to 9, insertion of the connector 30 into the recess 2 by pivoting the lever 32 allows a less insertion force of the connector 30 to electrically connect each resilient contact piece 23a of the terminal 23 to the associated conductor 3a of FPC 3. Thereby, the connector 30 (see FIG. 4) having more terminals than the connector 20 (see FIG. 1) of the first embodiment can be easily inserted into the recess 2. In addition, the deterioration of the resin case 1 would have no effect on the hollow frame 10B. Thus, the resilient contact piece 23a of the terminal 23 can maintain a stable electrical connection to the conductor 3a of FPC 3.

The hollow frames 10A, 10B of FIGS. 1, 4 related to the first and second embodiments are not illustrated to limit the present invention in configuration. That is, the hollow frames 10A, 10B may be replaced by a similar means which allows a stable electrical connection between the conductor 3a of FPC 3 and the resilient contact piece 23a of the terminal 23.

What is claimed is:

1. A connector connection structure to a flexible printed circuit board provided in an automobile meter, comprising:
   a case having an insertion recess in which said flexible printed circuit board is mounted;
   a connector having a terminal to contact said circuit board, said connector being insertable in said insertion recess so that a conductor of the circuit board can electrically connect to the terminal; and
   a hollow frame provided between said case and said circuit board, wherein said connector has a housing with a pivoting lever which is pivotably supported on an outer surface of said housing, and said terminal has a resilient contact piece extending from said housing, said pivoting lever being able to pivot freely from the resilient contact piece, said pivoting lever having a locking portion at one end thereof and a movement limiting portion at the other end thereof, said hollow frame having a locking channel and a retaining slit respectively associated with said locking portion and said movement limiting portion, wherein said movement limiting portion is engaged with said retaining slit so that said connector can be inserted into said insertion recess with a reduced mating force.

2. The connector connection structure set forth in claim 1, wherein said connector has a housing formed with a lock arm, said lock arm having a locking protrusion, and said hollow frame has a guide channel for receiving said lock arm, said guide channel having a locking portion associated with said locking protrusion.

3. The connector connection structure set forth in claim 1, wherein said pivoting lever has a thickness smaller than the extending height of said resilient contact piece from said housing.

4. The connector connection structure set forth in claim 1, wherein said hollow frame has a hardness larger than said case.

* * * * *